(12) United States Patent
Moriuma et al.

(10) Patent No.: US 6,274,287 B1
(45) Date of Patent: Aug. 14, 2001

(54) POSITIVE RESIST COMPOSITIONS COMPRISING A HYDROXYPHENYL KETONE

(75) Inventors: Hiroshi Moriuma; Yoshiyuki Takata, both of Toyonaka (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/598,949

(22) Filed: Jun. 22, 2000

(30) Foreign Application Priority Data

Jun. 24, 1999 (JP) .................................................. 11-178268

(51) Int. Cl.[7] .............................. G03F 7/004; G03F 7/023
(52) U.S. Cl. ..................... 430/270.1; 430/191; 430/192
(58) Field of Search .................................... 430/191, 192, 430/270.1

(56) References Cited

U.S. PATENT DOCUMENTS

| | | | |
|---|---|---|---|
| 5,219,701 | * 6/1993 | Schulz et al. | 430/191 |
| 5,290,657 | 3/1994 | Uetani et al. | 430/191 |
| 5,324,619 | * 6/1994 | Kawabe et al. | 430/191 |
| 5,374,742 | 12/1994 | Uetani et al. | 549/223 |
| 5,424,167 | 6/1995 | Uetani et al. | 430/191 |
| 5,434,031 | * 7/1995 | Nakao et al. | 430/191 |
| 5,456,995 | 10/1995 | Ozaki et al. | 430/191 |
| 5,456,996 | 10/1995 | Ozaki et al. | 430/191 |
| 5,529,881 | * 6/1996 | Kawabe et al. | 430/191 |
| 5,861,229 | 1/1999 | Osaki et al. | 430/191 |
| 5,948,587 | * 9/1999 | Kawabe et al. | 430/191 |

FOREIGN PATENT DOCUMENTS

| | | |
|---|---|---|
| A2831371 | 3/1998 | (EP) . |
| A1289947 | 11/1989 | (JP) . |
| 002560 | 1/1990 | (JP) . |

\* cited by examiner

*Primary Examiner*—John S. Chu
(74) *Attorney, Agent, or Firm*—Birch, Stewart, Kolasch & Birch, LLP

(57) ABSTRACT

A positive resist composition excellent in resolution, having a good balance with other performances required to resists and comprising an alkali-soluble resin, a radiation-sensitive ingredient and a hydroxyphenyl ketone compound represented by the following formula (I):

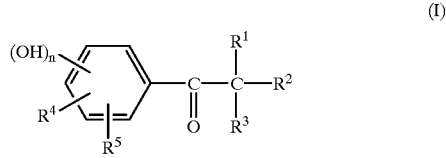

wherein $R^1$, $R^2$, $R^3$, $R^4$ and $R^5$ independently represent hydrogen, alkyl or alkoxy and n represents an integer of 1 to 3 is provided.

7 Claims, No Drawings

POSITIVE RESIST COMPOSITIONS COMPRISING A HYDROXYPHENYL KETONE

BACKGROUND OF THE INVENTION

The present invention relates to a positive type resist composition which is sensitive to a radiation such as ultra violet ray, deep ultra violet ray, including eximer laser, electron beam, ion beam and X-rays, and is suitably used in producing semiconductor integrated circuits.

A lithography process using a resist composition has usually been adopted in a fine processing of semiconductor integrated circuit. Among the resist composition, positive working types are widely used because of their generally superior resolution. The positive resists contain generally an alkali-soluble ingredient and a radiation-sensitive ingredient. Specifically, novolak-quinonediazide type resists are known which contain a novolak resin as an alkali-soluble ingredient and a quinonediazide compound as a radiation-sensitive ingredient, and utilize the decomposition of the quinonediazide compound by the action of radiation to generate a carboxylic group, which changes the compound from alkali-insoluble to alkali-soluble.

In recent years, according to the demand for higher integration level, an integrated circuit having a finer circuit and a pattern formation at a sub-micron level has become required. As the result, a positive resist composition having a still higher resolution has become demanded. For satisfying this demand, so-called chemical amplification type resists, which utilize the chemical amplifying action of acid-generator, have also been used in some field. There is still, however, a persistent need for the novolak-quinonediazide resists.

The resolving power of the novolak-quinonediazide type positive resists may be improved by increasing the amount of the radiation-sensitive quinonediazide compound. However, there is a limitation, since the light absorption of the resist becomes so large that the profile is deteriorated and a rectangular pattern shape can not be obtained, when the amount of quinonediazide compound is too much. JP-A-61-141441 discloses an improvement in the sensitivity, heat resistance and others by adding an unesterified 2,3,4-trihydroxybenzophenone in addition to 1,2-naphthoquinonediazidesulfonic acid ester of 2,3,4-trihydroxybenzophenone which is a radiation-sensitive ingredient. Moreover, JP-A-1-289947, JP-A-2-2560, JP-A-3-191351 and others disclose an improvement in sensitivity, resolution and others by adding various polyhydric phenol compounds in addition to an alkali-soluble resin and a radiation-sensitive ingredient.

An object of the present invention is to further improve the resolution of the positive resists containing an alkali-soluble resin and a radiation-sensitive ingredient without deteriorating other resist performances. As the result of studies, the present inventors have found that the resolution of a positive resist composition which contains an alkali-soluble resin and a radiation-sensitive ingredient can be further improved by adding a certain compound. Thus, the present invention has been completed.

SUMMARY OF THE INVENTION

The present invention provides a positive resist composition comprising an alkali-soluble resin, a radiation-sensitive ingredient and a hydroxyphenyl ketone compound represented by the following formula (I):

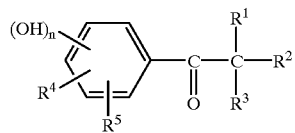

wherein $R^1$, $R^2$, $R^3$, $R^4$ and $R^5$ independently represent hydrogen, alkyl or alkoxy and n represents an integer of 1 to 3.

PREFERRED EMBODIMENT OF THE INVENTION

In the formula (I), $R^1$, $R^2$, $R^3$, $R^4$ and $R^5$ are the same or different from each other, and are hydrogen, alkyl or alkoxy, respectively. The alkyl may generally have about 1 to 5 carbon atoms; the alkoxy may generally have about 1 to 3 carbon atoms and is preferably methoxy or ethoxy; n, representing the number of hydroxyl groups on the benzene ring, may be 1 to 3. In addition, it is preferred that two of $R^1$, $R^2$ and $R^3$ are hydrogen. The remaining one is suitably hydrogen or alkyl. It is preferred that $R^4$ and $R^5$ positioned on the benzene ring are hydrogen, respectively.

Specific example of the hydroxyphenyl ketone compound represented by the formula (I) include the following compounds:

A: 2'-hydroxyacetophenone,
B: 3'-hydroxyacetophenone,
C: 4'-hydroxyacetophenone,
D: 2'-hydroxypropiophenone,
E: 3'-hydroxypropiophenone,
F: 4'-hydroxypropiophenone,
G: 2',4'-dihydroxyacetophenone,
H: 2',5'-dihydroxyacetophenone,
I: 2',6'-dihydroxyacetophenone,
J: 3',4'-dihydroxyacetophenone,
K: 3',5'-dihydroxyacetophenone,
L: 2',3',5'-trihydroxyacetophenone,
M: 4'-hydroxy-3'-methylacetophenone,
N: 2'-hydroxy-5'-methylacetophenone,
and the like.

Among them, when n representing the number of hydroxyl groups on the benzene ring in the formula (I) is 1, compounds in which the hydroxyl group is positioned on 3- or 4-position in respect to the carbonyl, such as 3'-hydroxyacetophenone, 4'-hydroxyacetophenone and 4'-hydroxypropiophenone, are preferred. When n is 2 or 3, compounds in which one of the hydroxyl groups is positioned on 2-position, such as 2',4'-dihydroxyacetophenone, 2',5'-dihydroxyacetophenone, 2',6'-dihydroxyacetophenone and 2',3',5'- 5 trihydroxyacetophenone, are preferred.

The positive resist composition of the invention comprises an alkali-soluble resin and a radiation-sensitive ingredient. Those commonly used in this technical field of the invention may be used as an alkali-soluble resin or a radiation-sensitive ingredient. As examples of the alkali-soluble resin, a polyvinyl phenol, a novolac resin, and the like may be mentioned. Among them, a novolac resin is preferred. A novolac resin can usually be obtained by condensing a phenol compound and an aldehyde in the presence of an acid catalyst.

Examples of the phenol compound used in the preparation of the novolac resin include phenol, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 4-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 2-ethylphenol, 3-ethylphenol, 4-ethylphenol, 2,5-diethylphenol, 3,5-diethylphenol, 2,3,5-triethylphenol and a polyhydroxytriphenylmethane compound obtainable by condensation of xylenol and hydroxybenzaldehyde. These phenol compounds can be used singly or in combination of two or more.

Examples of the aldehyde used in the preparation of the novolac resin include aliphatic aldehydes such as formaldehyde, acetaldehyde, propionaldehyde, n-butylaldehyde, iso-butylaldehyde and pivalaldehyde; licyclic aldehydes such as cyclohexanealdehyde, clopentanealdehyde and furfural; aromatic aldehydes such as benzaldehyde, o-hydroxybenzaldehyde, m-hydroxybenzaldehyde, p-hydroxybenzaldehyde, o-anisaldehyde, m-anisaldehyde and p-anisaldehyde; and aromatic-aliphatic aldehydes such as phenylacetaldehyde. These aldehydes can be used singly or in combination of two or more. Among these aldehydes, formaldehyde is preferably used because of easy availability in the industry.

Examples of the acid catalyst used for condensation of the phenol compound with the aldehyde compound include inorganic acids such as hydrochloric acid, sulfuric acid, perchloric acid and phosphoric acid; organic acids such as formic acid, acetic acid, oxalic acid, trichloroacetic acid and p-toluenesulfonic acid; and bivalent metal salts such as zinc acetate, zinc chloride and magnesium acetate. These acid catalysts can be used singly or in combination of two or more. The condensation reaction can be carried out according to the usual manner, for example, at a temperature within a range of 60 to 120° C. for 2 to 30 hours.

It is preferred that the content of lower molecular weight fraction in the novolak resin obtained by the condensation reaction is lowered, for example, by fractionation. Specifically, it is preferred that the pattern area of the resin corresponding to polymers having a molecular weight of 1,000 or less is 25% or less, more preferably 20% or less, of the total pattern area excepting the area for the unreacted phenol compound as the raw material. The pattern area herein refers to an area measured by GPC with an UV detector at 254 nm. The molecular weight herein refers to a value obtained using polystyrene as the standard. For carrying out the fractionation, adoptable methods include: a method in which a novolak resin is dissolved in a good solvent, and then the solution is poured into water for precipitating the higher molecular weight fraction; and a method in which said solution is mixed with a poor solvent such as pentane, hexane or heptane, and the lower layer containing mainly the higher molecular weight fraction is separated. Examples of the good solvent include alcohols such as methanol and ethanol, ketones such as acetone, methyl ethyl ketone and methyl isobutyl ketone, glycol ethers such as ethyl cellosolve, glycol ether esters such as ethyl cellosolve acetate, ethers such as tetrahydrofuran, or else.

A quinonediazide compound, such as an o-quinonediazide sulfonic acid ester of a compound having a phenolic hydroxyl group, is generally used as the radiation-sensitive ingredient. Preferably, a 1,2-naphthoquinonediazide-5- or 4-sulfonic acid ester or a 1,2-benzoquinonediazide-4-sulfonic acid ester of a polyhydroxyl compound having at least three phenolic hydroxyl groups is used. These radiation-sensitive quinonediazide compounds can be used singly or in combination of two or more.

Examples of compounds having a phenolic hydroxyl group to be esterified with quinoneazidesulfonic acid include tri-, tetra- or penta-hydroxybenzophenone; and poly-nucleic novolak compounds such as tri-nucleic, tetra-nucleic, penta-nucleic or hexa-nucleic compound in which plurality of phenol nuclei which may optionally be substituted with alkyl, specifically phenol nucleus, cresol nucleus, xylenol nucleus or the like, are bound in any desired order with intervention of methylene.

An o-quinonediazide sulfonic acid esters can be obtained by reacting a compound having a phenolic hydroxyl group as described above with an o-quinonediazidesulfonyl halide in the presence of a base such as triethylamine in a suitable solvent. After completion of the reaction, the desired quinonediazidesulfonic acid ester can be isolated by appropriate post treatment. Such post treatment includes, for example, a method in which the reaction mass is mixed with water to precipitate the desired compound, which is filtered and dried to give the product in powder form; and a method in which the reaction mass is treated with a resist solvent such as 2-heptanone, washed with water, phase-separated, stripped of the solvent by distillation or equilibrium flash distillation to give the product in the form of a solution in a resist solvent, and others. The equilibrium flash distillation here refers to a kind of continuous distillation that is performed by evaporating a part of a liquid mixture, contacting sufficiently the produced vapor phase with the liquid phase, and separating the vapor and liquid phases when the equilibrium is attained. This method is suitable to concentration of heat sensitive substance, because the evaporation efficacy is very good, the evaporation occurs in a moment and the equilibrium between the vapor and liquid phases is rapidly attained.

In the present invention, a hydroxyphenyl ketone compound represented by the formula (I) is included as a lower molecular alkali-soluble ingredient, in addition to the alkali-soluble resin and the radiation-sensitive ingredient as described above. Particularly, a high effect is exerted by using a novolak resin in which the lower molecular weight fractions are lowered as described above as an alkali-soluble resin and adding a hydroxyphenyl ketone compound as defined in the invention thereto. Furthermore, it is effective to co-use an alkali-soluble phenol compound having a molecular weight of 1,000 or less in addition to the hydroxyphenyl ketone compound as defined in the invention. The alkali-soluble phenol compound having a lower molecular weight to be co-used is preferably a compound having at least two phenolic hydroxyl groups in the molecular structure, and in addition, having at least two benzene rings having a hydroxyl group in the molecular structure. Still, it is generally suitable that the alkali-soluble phenol compound having a lower molecular weight to be co-used do not have a carbonyl group. Specific examples thereof include compounds disclosed in JP-A-1-289947, JP-A-2-2560, JP-A-2-275995, JP-A-3-191351 and JP-A-5-232697.

In the resist composition of the invention, the radiation-sensitive ingredient is generally used in an amount of about 10 to 100 parts by weight based on 100 parts by weight of the total weight of the alkali-soluble ingredients which includes an alkali-soluble resin, the hydroxyphenyl ketone compound of the invention and other lower molecular weight alkali-soluble phenol compound if used, although the used amount varies depending on the resist type. Preferred content of the radiation-sensitive ingredient is about 10 to 50 parts by weight based on 100 parts by weight of the alkali-soluble ingredients as described above. In addition, it is preferred that the hydroxyphenyl ketone compound of the formula (I) is contained in a range of 3 to 40% by weight based on the total amount of the alkali-soluble ingredients described above. Furthermore, when a lower molecular weight phenol compound other than the formula (I) is used, it is preferred that the total amount of the hydroxyphenyl ketone compound of the formula (I) and the lower molecular weight phenol compound other than it, which are the lower molecular weight alkali-soluble ingredients, is in a range of 3 to 40% by weight based on the total amount of the alkali-soluble ingredients.

The positive resist composition of the present invention comprises the alkali-soluble resin, a radiation-sensitive ingredient and the low-molecular weight alkali-soluble component including hydroxyphenyl ketone compound of formula (I), described above. In addition, the positive resist composition of the present invention may comprise a resin other than the alkali-soluble resin, as well as a small amount of various additives conventionally used in this technical field of the invention, such as a dye and a surfactant, as required. Further, it is also effective to comprise a compound degradable by alkali, such as an acid generator, proposed in JP-A-10-213905, which generates an acid by the action of an alkali-developing solution. Addition of the alkali-degradable compound may contribute the improvement of pattern profile.

The positive resist composition of the invention is applied on a substrate such as a silicon wafer in the form of a resist solution prepared by dissolving the ingredients described above in a solvent. Any solvent that can dissolve the ingredients, has an appropriate drying rate and can make a uniform and smooth coating film after the evaporation of the solvent can be used for the resist solution. The solvent may be one conventionally used in this technical field of the invention. Examples of the solvent include glycol ether esters such as ethyl cellosolve acetate, methyl cellosolve acetate, propylene glycol monomethyl ether acetate and propylene glycol monoethyl ether acetate; glycol ethers such as ethyl cellosolve, methyl cellosolve, propylene glycol monomethyl ether and propylene glycol monoethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents can be used singly or in combination of two or more.

The resist film formed by applying the resist solution on a substrate and drying is irradiated with a radiation ray for patterning. Then, after a post-exposure baking is conducted, if necessary, the irradiated resist film is developed with an alkali developer. The alkali developer used here can be various aqueous alkali solutions known in the technical field of the invetion. Widely used developers generally include an aqueous solution of tetramethyl ammonium hydroxide and an aqueous solution of (2-hydroxyethyl) trimethyl ammonium hydroxide (generally called as choline).

The invention will now be described in more specifically with reference to Examples, which should not be construed as a limitation upon the scope of the invention. In Examples, percentages, parts and ratios representing the content or the used amount are weight basis unless otherwise specified. The weight average molecular weight is a value measured by GPC using polystyrene as a standard.

REFERENCE EXAMPLE 1 (Preparation of a Novolac Resin)

Into a reaction vessel equipped with a reflux tube, a stirrer and a thermometer were charged 479.7 parts of a mixed m-/p-cresol comprising 61.6% of m-cresol, 115.1 parts of p-cresol, 268.75 parts of 2,5-xylenol, 39.3 parts of oxalic acid dehydrate, 261.8 parts of 90aqueous acetic acid solution and 803.1 parts of methyl isobutyl ketone, and the mixture was heated to 80° C. To this mixture was added dropwise 463.2 parts of 37% formalin over 30 minutes. The mixture was heated up to 92° C. and allowed to react at this temperature for 13 hours keeping reflux. After the reaction was terminated, 486.2 parts of methyl isobutyl ketone was added and the mixture was washed with 1823.2 parts of water, followed by a phase-separation. This operation was repeated 6 times. Thereafter, the oily phase was concentrated to give a solution of a novolac resin in methyl isobutyl ketone. The resin had a weight average molecular weight of about 4,400. The solution was diluted with methyl isobutyl ketone to a concentration of 20%. To 400 parts of the 20% solution was added 545.2 parts of n-heptane with stirring. The mixture was stirred further at 60° C. for 30 minutes, left to stand and subjected to phase-separation. Then, 76.3 parts of the lower layer was diluted with 400 parts of 2-heptanone and concentrated to give a 2-heptanone solution containing 38.2% of novolac. The novolac resin was referred to as Resin R1. The resin had a weight average molecular weight of about 7,200 and a ratio of area in GPC pattern of a range corresponding to 1,000 or less in the molecular weight of about 20%.

REFERENCE EXAMPLE 2 (Preparation of another Novolac Resin)

Into a reaction vessel equipped with a reflux tube, a stirrer and a thermometer were charged 702.1 parts of a mixed m-/p-cresol comprising 61.6% of m-cresol, 379.2 parts of p-cresol, 25.5 parts of oxalic acid dihydrate, 337.9 parts of 90% aqueous acetic acid solution, 1008 parts of methyl isobutyl ketone and 123 parts of water, and the mixture was heated to 80° C. To this mixture was added dropwise 492.9 parts of 37% formalin over 1 hour. The mixture was heated up and allowed to react at this temperature for 12 hours keeping reflux. After the reaction was terminated, the mixture was diluted with methyl isobutyl ketone, then washed with water and dried to obtain a methyl isobutyl ketone solution containing 40.1% of novolac resin. In a flask equipped with a draining cock at the bottom, was charged 200 parts of the novolac resin solution, and it was diluted with 335 parts of methyl isobutyl ketone. Thereto, was added 412 parts of n-heptane. The mixture was stirred further at 60° C. and left to stand, followed by being subjected to phase-separation. Then, the lower layer, the novolac resin solution, was diluted with 2-heptanone and concentrated to give a 2-heptanone solution containing 36.0% of novolac. The novolac resin was referred to as Resin R2. The resin had a weight average molecular weight of about 9,800 and a ratio of area in GPC pattern of a range corresponding to 1,000 or less in the molecular weight of about 4%.

Examples and Comparative Example in which resist compositions were prepared and evaluated are shown below. The resin, radiation-sensitive ingredient and lower molecular weight alkali-soluble ingredient, commonly used in the following Examples and Comparative Example, are listed below.

Resin: A mixture in the solid content ratio of 85/15 of respective 2-heptanone solutions of Resin R1 and Resin R2 obtained in Reference Examples 1 and 2.

Radiation-sensitive ingredient:

PAC 1, a photosensitive agent: a condensation product in a reaction molar ratio of 1:2 of 4,4'-methylenebis [2-(2- hydroxy-5-methylbenzyl)-3,6-dimethylphenol] and 1,2-naphthoquinonediazide-5-sulfonic acid chloride, having a structure represented by the following formula:

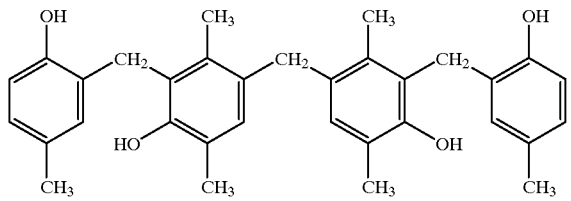

PAC 2, a photosensitive agent: a condensation product in a reaction molar ratio of 1:2 of 2,3,4-trihydroxybenzophenone and 1,2-naphthoquinonediazide-5-sulfonic acid chloride.

Lower molecular weight alkali-soluble ingredients (symbols other than X are the same as those used in the above list):

B: 3'-hydroxyacetophenone,
C: 4'-hydroxyacetophenone,
F: 4'-hydroxypropiophenone,
G: 2',4'-dihydroxyacetophenone,
H: 2',5'-dihydroxyacetophenone,
I: 2',6'-dihydroxyacetophenone,
L: 2',3',5'-trihydroxyacetophenone,
X: 4-(1',2',3',4',4'a,9'a-hexahydro-6'-hydroxyspiro[cyclohexane-1,9'-xanthene]-4'a-yl)resorcinol represented by the following formula:

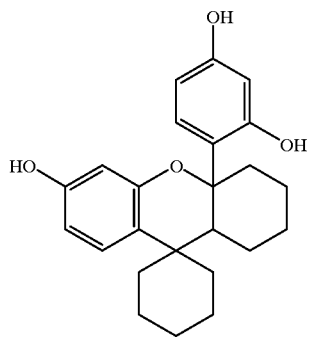

EXAMPLE AND COMPARATIVE EXAMPLE

The following ingredients were mixed and filtered by a fluorine resin filter to give resist solutions.

| Resin: (solid content) | 11.5 parts* |
| --- | --- |
| Radiation-sensitive ingredients: | |
| photosensitive agent PAC 1 | 3.5 parts |
| photosensitive agent PAC 2 | 1.75 parts |
| Lower molecular weight alkali-soluble ingredients: | |
| compound X | 2.0 parts |
| compounds in Table 1 | 1.0 part |
| 1,1-bis(4-hydroxyphenyl)cyclohexane | 0.5 part |
| Alkali-decomposing compound: | |
| N-(2-oxobornane-10-ylsulfonyloxy)succinimide | 0.5 part |

| Solvents: | |
| --- | --- |
| 2-heptanone | 56.5 parts** |
| γ-butyrolactone | 0.5 part |

*solid content
**2-Heptanone includes the amount derived from the solution of the novolac resin.

The resist solutions prepared above were spin-coated on silicon wafers treated with hexamethyldisilazane and subjected to pre-bake at 90° C. for 60 seconds on a direct hot-plate to form resist film having a thickness of 1.06 μm. The resist film was exposed to a line-and-space pattern varying stepwise the exposure amount using an i-ray stepper ["NSR-2005 i9C", manufactured by Nikon, NA=0.57, σ=0.60]. Then, the exposed resist film was subjected to post-exposure bake on a hot plate at 110° C. for 60 seconds, and to paddle development in a 2.38% aqueous tetramethyl ammonium hydroxide solution for 60 seconds. The developed patterns were observed by a scanning electron microscope and the effective sensitivity and revolution for the pattern were evaluated in the following manners. The results are shown in Table 1.

Effective sensitivity: This is expressed by an exposure amount at which the cross-sections of 0.35 μm line-and-space pattern become 1:1.

Resolution: This is expressed by the minimum line width in the line-and-space pattern which is separated upon exposure amount at the effective sensitivity.

TABLE 1

| No. | Lower molecular weight alkali soluble ingredient | Effective sensitivity msec | Resolution μm |
| --- | --- | --- | --- |
| Example | | | |
| 1 | B | 300 | 0.30 |
| 2 | C | 300 | 0.30 |
| 3 | F | 300 | 0.29 |
| 4 | G | 300 | 0.30 |
| 5 | H | 320 | 0.29 |
| 6 | I | 340 | 0.28 |
| 7 | L | 300 | 0.30 |
| Comparative example | X* | 260 | 0.32 |

*In Comparative example, only 3 parts in total of the compound X was used as the lower molecular weight alkali soluble ingredient.

The positive resist composition of the invention is excellent in resolution. In addition, it has a good balance with other performances required to resists, for example, sensitivity. Therefore, the composition is effective in making the semiconductor integrated circuits finer.

What is claimed is:

1. A positive resist composition comprising an alkali-soluble resin, a radiation-sensitive ingredient and a hydroxyphenyl ketone compound represented by the following formula (I):

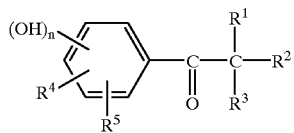 (I)

wherein $R^1$, $R^2$, $R^3$, $R^4$ and $R^5$ independently represent hydrogen, alkyl or alkoxy and n represents an integer of 1 to 3.

2. The positive resist composition according to claim 1, wherein two of $R^1$, $R^2$ and $R^3$ are hydrogen.

3. The positive resist composition according to claim 2, wherein all of $R^1$, $R^2$ and $R^3$ are hydrogen, or two of $R^1$, $R^2$ and $R^3$ are hydrogen and the remaining one is alkyl.

4. The positive resist composition according to claim 1, wherein n in the formula (I) is 1 and the hydroxyl group is positioned on 3- or 4-position in respect to the carbonyl.

5. The positive resist composition according to claim 1, wherein n in the formula (I) is 2 or 3 and the hydroxyl group is positioned on 2-position in respect to the carbonyl.

6. The positive resist composition according to claim 1, wherein the alkali-soluble resin is a novolac resin, and the pattern area of the resin corresponding to polymers having a molecular weight of 1,000 or less is 25% or less of the total pattern area excepting the area for the unreacted phenol compound.

7. The positive resist composition according to claim 6, which further comprises an alkali-soluble phenol compound having a molecular weight of 1,000 or less other than the hydroxyphenyl ketone compound.

* * * * *